United States Patent
Harada

(10) Patent No.: US 9,013,007 B2
(45) Date of Patent: Apr. 21, 2015

(54) SEMICONDUCTOR DEVICE HAVING DEPLETION TYPE MOS TRANSISTOR

(75) Inventor: Hirofumi Harada, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 13/065,674

(22) Filed: Mar. 28, 2011

(65) Prior Publication Data

US 2011/0233669 A1   Sep. 29, 2011

(30) Foreign Application Priority Data

Mar. 29, 2010   (JP) .................................. 2010-076366

(51) Int. Cl.
*H01L 29/66*   (2006.01)
*H01L 29/10*   (2006.01)
*H01L 29/78*   (2006.01)

(52) U.S. Cl.
CPC ........ *H01L 29/6659* (2013.01); *H01L 29/1083* (2013.01); *H01L 29/7838* (2013.01)

(58) Field of Classification Search
USPC .......... 257/336, E21.417, E21.618, 402–404, 257/285, 335, 348; 438/174, 194, 217, 276, 438/282, 289, 291
See application file for complete search history.

(56) References Cited

U.S. PATENT DOCUMENTS

| | | | | |
|---|---|---|---|---|
| 4,212,683 A * | 7/1980 | Jones et al. | .................... | 438/289 |
| 4,575,746 A * | 3/1986 | Dingwall | ...................... | 257/506 |
| 5,548,143 A * | 8/1996 | Lee | .............................. | 257/269 |
| 5,567,965 A * | 10/1996 | Kim | .............................. | 257/336 |
| 5,929,486 A * | 7/1999 | Kitakado | ....................... | 257/345 |
| 6,472,284 B2 * | 10/2002 | Kim | .............................. | 438/305 |
| 6,518,623 B1 * | 2/2003 | Oda et al. | ....................... | 257/330 |
| 6,887,758 B2 * | 5/2005 | Chindalore et al. | .......... | 438/257 |
| 2005/0142785 A1 * | 6/2005 | Bang | ............................. | 438/305 |

OTHER PUBLICATIONS

Patent Abstracts of Japan, publication No. 07-161978, publication date Jun. 23, 1995.

* cited by examiner

*Primary Examiner* — Jose R Diaz
(74) *Attorney, Agent, or Firm* — Adams & Wilks

(57) ABSTRACT

A depletion type MOS transistor includes a well region having a first conductivity type and formed on a semiconductor substrate, a gate insulating film formed on the well region, and a gate electrode formed on the gate insulating film. Source and drain regions having a second conductivity type different from the first conductivity type are formed on respective sides of the gate electrode and within the well region. A first low concentration impurity region has the second conductivity type and is formed below the gate insulating film between the source and drain regions and within the well region. A second low concentration impurity region has the first conductivity type and is formed below the first low concentration impurity region between the source and drain regions and within the well region.

20 Claims, 5 Drawing Sheets

1

SEMICONDUCTOR DEVICE HAVING DEPLETION TYPE MOS TRANSISTOR

RELATED APPLICATIONS

This application claims priority under 35 U.S.C. §119 to Japanese Patent Application No. JP2010-076366 filed on Mar. 29, 2010, the entire content of which is hereby incorporated by reference.

BACKGROUND OF THE INVENTION

1. Field of the Invention

The present invention relates to a semiconductor device having a depletion type MOS transistor with a buried channel.

2. Description of the Related Art

One of transistor classifications divides MOS transistors into a normally-off type in which no current flows between the drain and the source when the gate voltage is 0 and a normally-on type in which a current flows between the drain and the source when the gate voltage is 0. The former is referred to as an enhancement type MOS transistor whereas the latter is referred to as a depletion type MOS transistor. For example, a depletion type N-channel MOS transistor is designed to have a threshold voltage of a negative value.

FIG. 2 is a schematic sectional view of a common depletion type N-channel MOS transistor. All N-channel MOS transistors, without regard to depletion type or enhancement type, are formed on a P-type well region 5 having a concentration of approximately $1 \times 10^{15}/cm^3$ to $1 \times 10^{17}/cm^3$. A difference between the depletion type and the enhancement type MOS transistor is that, in the depletion type MOS transistor, a low concentration N-type impurity region 3 having a concentration of $1 \times 10^{17}/cm^3$ to $5 \times 10^{18}/cm^3$ is formed in a channel region 9, which is below a gate oxide film 10, and constitutes an N-type current path together with N-type source/drain regions 2, which are on both sides of an N-type gate electrode 8 having a concentration of $1 \times 10^{19}/cm^3$ or higher. With this structure, applying a voltage between the drain/source regions causes a current to flow through the current path constituted of a group of N-type impurity regions even when the voltage applied to the gate electrode is 0 V.

The electrical operation of the common depletion type N-channel MOS transistor is described next. As described above, when the gate voltage is 0 V, a current flows between the N-type source/drain regions via the low concentration N-type impurity region according to a drain-source voltage. The top of this current path is an interface with the gate oxide film and the bottom of this current path is an interface within a PN junction between the P-type well region and the low concentration N-type impurity region. More strictly, the bottom of the current path corresponds to the top of a depletion layer formed in the vicinity of the PN junction between the P-type well region and the low concentration N-type impurity region. When the positive gate voltage is applied, more electrons are induced in the low concentration N-type impurity region, causing a larger current to flow.

When the negative gate voltage is applied, on the other hand, depletion starts downward, from the gate oxide film interface of the low concentration N-type impurity region, narrowing the current path in the PN junction between the low concentration N-type impurity region and the P-type well region according to the voltage increase in negative side, which lowers the current value accordingly.

Further increase in the gate voltage to the negative side brings the depletion layer, which is generated from the gate oxide film interface with the low concentration N-type impurity region, into contact with another depletion layer, which is formed by the PN junction between the low concentration N-type impurity region and the P-type well region, and the current path is lost and the current value reaches 0. Generally, the gate voltage value at this point is regarded as a threshold voltage of the depletion type N-channel MOS transistor, and takes a negative value.

As can be understood from the above, the current flow path is constituted mainly of a deep part that is closer to the semiconductor substrate side than the gate oxide film, and this is why depletion type MOS transistors are also called as buried channel MOS transistors. Enhancement type MOS transistors, on the other hand, are commonly surface channel transistors.

In order to produce a depletion type N-channel MOS transistor whose electrical operation and structure are as described above by a semiconductor manufacture process, a channel forming step of implanting N-type impurities below the gate oxide film is added prior to the forming of the gate oxide film, or at a point before the forming of the gate electrode and after the forming of the gate oxide film. The N-type impurities to be implanted are phosphorus or arsenic, and introduced by ion implantation at a dose between $1 \times 10^{11}/cm^2$ and $1 \times 10^{13}/cm^2$.

Depletion type MOS transistors produced in this manner are used in many cases as a constant current source in a semiconductor integrated circuit to take advantage of their characteristics as the normally-on type. In another application example, a depletion type MOS transistor constitutes a constant voltage circuit by making use of its constant current. Those uses are found particularly often in analog circuits, and a depletion type MOS transistor that has a more precise constant current property can contribute more to the enhancement of analog circuit performance and the lowering of the overall cost of an analog circuit.

Specifically, a depletion type MOS transistor in an analog circuit is required to be precise in threshold voltage and in current driving ability. However, the threshold voltage of depletion type N-channel MOS transistors generally fluctuates more than the threshold voltage of enhancement type N-channel MOS transistors.

The reason is that, whereas the following three parameters generally determine the threshold voltage of enhancement type N-channel MOS transistors, depletion type N-channel MOS transistors additionally have the depth of a channel impurity region as one of parameters relevant to the threshold voltage.

1) Channel impurity concentration
2) Gate oxide film thickness
3) Flat band voltage determined by fixed charge and other factors A method involving producing a depletion type MOS transistor and a method involving reducing the transistor's degradation and fluctuation in characteristics are disclosed in, for example, JP 07-161978 A.

Still, conventional depletion type MOS transistors have the following problem. The extension of the depletion layer in the channel is involved in the magnitude of the threshold voltage of a depletion type MOS transistor as described above. A voltage required to cause the extension of the depletion layer is in proportion to the square of the extension of the depletion layer, and hence a fluctuation in depletion layer distance changes the threshold voltage significantly. The depletion layer distance corresponds to the depth of the N-type impurity region in the case of N-channel MOS transistors, and varies depending on the unevenness of heat treatment performed after the N-type impurity implantation and on a concentration fluctuation in a deep part of the P-type well layer, which are difficult to reduce. The threshold voltage of depletion type MOS transistors therefore fluctuates much more than the threshold voltage of enhancement type MOS transistors. The fluctuation may be absorbed in an analog circuit by employing a design or specifications that have a large margin, but this gives rise to a problem by making it difficult to provide a high precision analog IC at a low cost.

SUMMARY OF THE INVENTION

In order to solve this problem, the present invention is structured as follows.

First, there is provided a depletion type MOS transistor, including: a first conductivity type well region on a semiconductor substrate; a gate insulating film formed on the first conductivity type well region; a gate electrode formed on the gate insulating film; second conductivity type source/drain regions formed on both sides of the gate electrode within the first conductivity type well region; a (first) low concentration second conductivity type impurity region formed below the gate insulating film between the second conductivity type source/drain regions within the first conductivity type well region; and a (second) low concentration first conductivity type impurity region formed below the low concentration second conductivity type impurity region between the second conductivity type source/drain regions within the first conductivity type well region.

Further, in the depletion type MOS transistor, the low concentration first conductivity type impurity region is formed apart from the second conductivity type source/drain regions.

Further, in the depletion type MOS transistor, the low concentration first conductivity type impurity region is set at a distance of 0.5 μm to 1.5 μm from the second conductivity type source/drain regions.

Further, in the depletion type MOS transistor, the low concentration first conductivity type impurity region has a peak concentration of $5.0\times10^{16}/cm^3$ to $1.0\times10^{18}/cm^3$.

In addition, in the depletion type MOS transistor, the low concentration second conductivity type impurity region has a peak concentration of $1.0\times10^{17}/cm^3$ to $5.0\times10^{18}/cm^3$.

According to the present invention, a depletion type MOS transistor reduced in threshold voltage fluctuation can be produced, and consequently, a semiconductor integrated circuit that has a low cost, high performance analog circuit can be provided.

DETAILED DESCRIPTION OF THE PREFERRED EMBODIMENTS

Embodiments of the present invention are described below with reference to the drawings.

Figure 1:
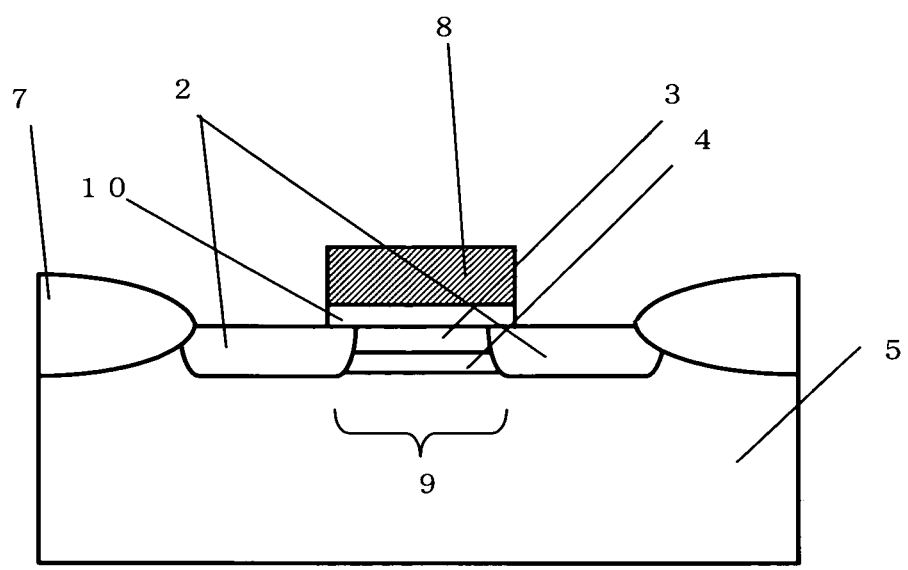
FIG. 1 is a schematic sectional view of a depletion type N-channel MOS transistor according to a first embodiment of the present invention.
Figure 2:
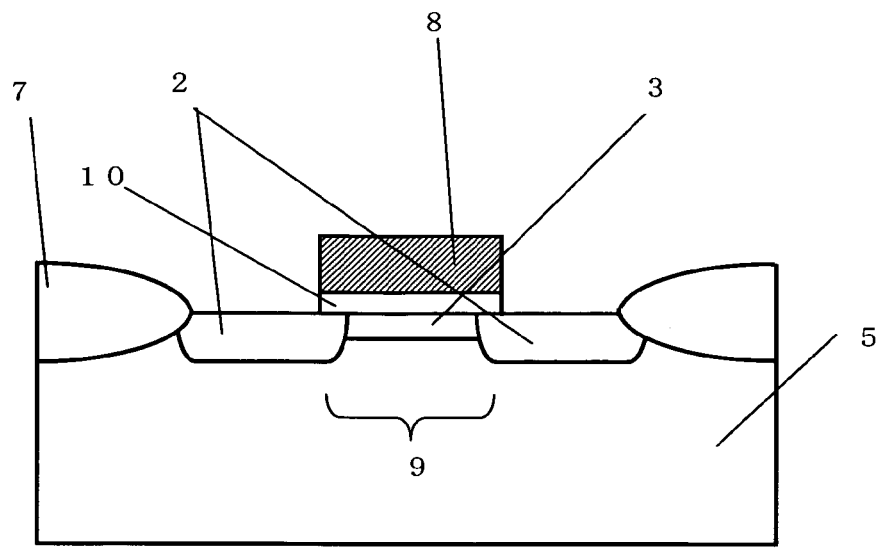
FIG. 2 is a schematic sectional view of a conventional depletion type N-channel MOS transistor.

FIG. 1 is a schematic sectional view of a depletion type (normally-on type) N-channel MOS transistor according to a first embodiment of the present invention. The first embodiment differs from conventional methods in that a low concentration P-type impurity region 4 higher in concentration than the P-type well region 5 is newly formed by ion implantation below the low concentration N-type impurity region 3 that serves as the channel. With this structure, when uneven heat treatment increases the depth of the low concentration N-type impurity region 3, the tail of the low concentration N-type impurity region is cancelled out by the diffusion of impurities from the surface side of the low concentration P-type impurity region 4. As a result, a fluctuation in the location of a junction between the low concentration N-type impurity region and its underlying low concentration P-type impurity region is decreased and a fluctuation in threshold voltage is accordingly reduced.

The concentration peaks of the low concentration N-type impurity region and the low concentration P-type impurity region, which are determined by the ion implantation energy, fluctuate very slightly. Therefore, a fluctuation in depth at the time of the implantation only causes a negligibly small fluctuation in threshold voltage.

The depths and concentrations of the low concentration N-type impurity region and the low concentration P-type impurity region may be set to various patterns by selecting appropriate ion implantation conditions.

Figure 4:
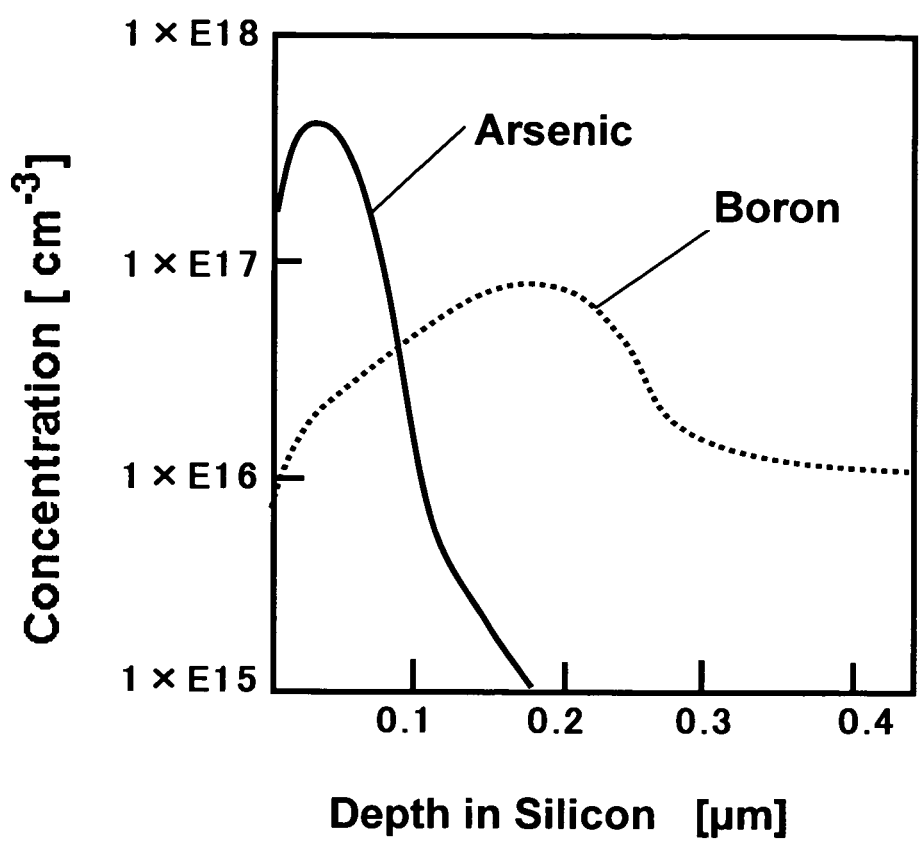
FIG. 4 is a graph illustrating an impurity concentration distribution in a depth direction of a depletion type N-channel MOS transistor according to the present invention.

For example, the graph of FIG. 4 illustrates an impurity concentration distribution that is observed when the condition for the ion implantation of the low concentration N-type impurity region is to implant arsenic at an implantation energy of 50 keV and a dose of $1.7\times10^{12}/cm^2$, and the condition for the subsequent ion implantation of the low concentration P-type impurity region is to implant boron at 40 keV and $1.0\times10^{12}/cm^2$. By controlling the depth of the P-type impurity region via the implantation energy in this manner, the low concentration P-type impurity region can be set right under the low concentration N-type impurity region, without changing the junction location of the low concentration N-type impurity region.

Since the P-type impurity region uses boron, if an excessive heat treatment performed after formation of the channel impurity region, the diffusion of boron toward the surface may outpace the downward diffusion of arsenic, pushing the junction location of the low concentration N-type impurity region to a shallow point. To avoid such a case a larger value is set to the ion implantation energy for forming the low concentration P-type impurity region. For instance, the junction location can be set deeper by about 0.05 μm by changing the boron implantation energy from 40 keV to 60 keV.

Figure 5:
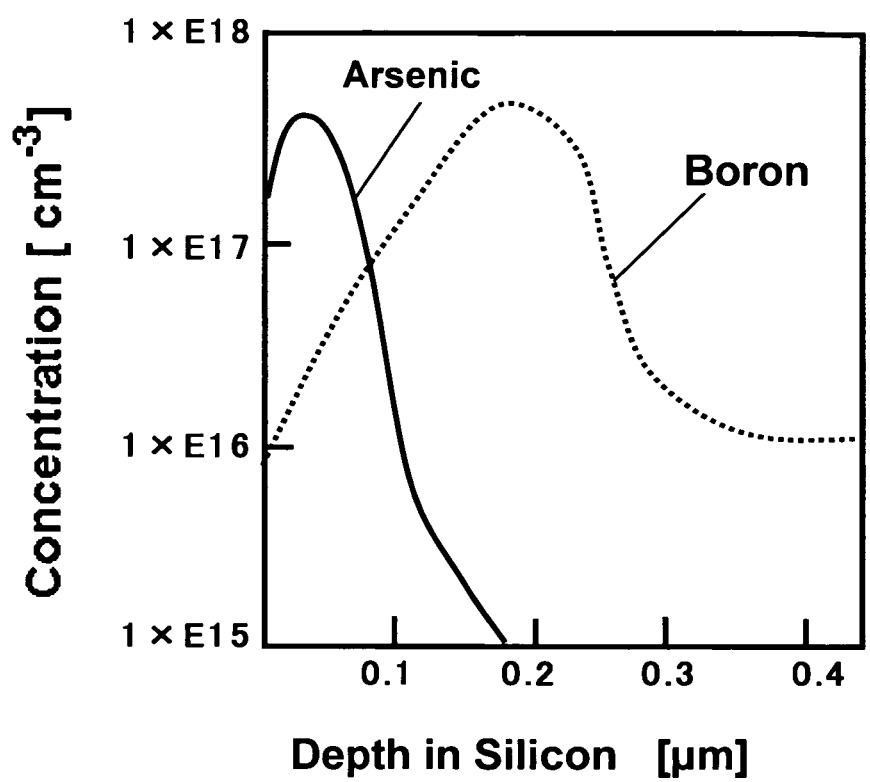
FIG. 5 is another graph illustrating the impurity concentration distribution in the depth direction of the depletion type N-channel MOS transistor according to the present invention.

FIG. 5 illustrates an impurity concentration distribution formed by an ion implantation of arsenic as a low concentration N-type impurity at an implantation energy of 50 keV and at a dose of $1.7\times10^{12}/cm^2$, followed by a subsequent ion implantation of boron as a low concentration P-type impurity at 40 keV and $5.0\times10^{12}/cm^2$. When the amount of impurities implanted in the low concentration P-type impurity region is too large, the diffusion toward the surface becomes dominant as described above, and a depth fluctuation due to heat treatment of the low concentration P-type impurity region is allowed to control the rate of a junction surface between the low concentration N-type impurity region and its underlying low concentration P-type impurity region. A desirable maximum peak concentration of the low concentration P-type impurity region is therefore equal to or smaller than a maximum peak concentration of the low concentration N-type impurity region.

In the example given above, where the condition for the ion implantation of the low concentration N-type impurity region is to implant arsenic at 50 keV and $1.7 \times 10^{12}/cm^2$, a desirable ion implantation condition for implanting boron in the low concentration P-type impurity region is to set the implantation energy to a range between 40 keV to 70 keV and the dose to a range between $1.0 \times 10^{12}/cm^2$ and $5.0 \times 10^{12}/cm^2$. However, as described above, the optimum set values vary depending on the magnitude of the effect of the subsequent heat treatment. The final peak concentration of the low concentration N-type impurity region which is obtained after various types of heat treatment is $1.0 \times 10^{17}/cm^3$ to $5.0 \times 10^{18}/cm^3$, whereas the final peak concentration of the low concentration P-type impurity region is desired to be $5.0 \times 10^{16}/cm^3$ to $1.0 \times 10^{18}/cm^2$ in order to reduce the fluctuation in threshold voltage.

A method of producing the depletion type N-channel MOS transistor according to the present invention is described next with reference to FIGS. 6A to 6E.

Figure 6A:
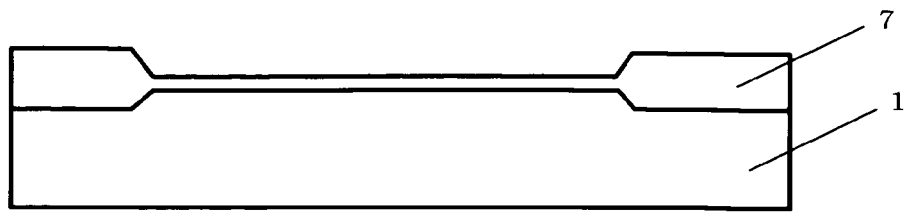
FIGS. 6A to 6E are sectional views illustrating a process flow for producing the depletion type N-channel MOS transistor according to the present invention.
Figure 6B:
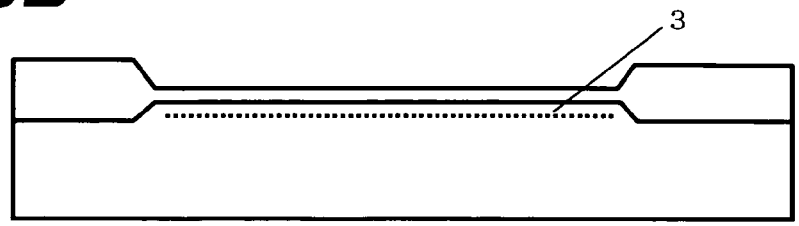
Figure 6C:
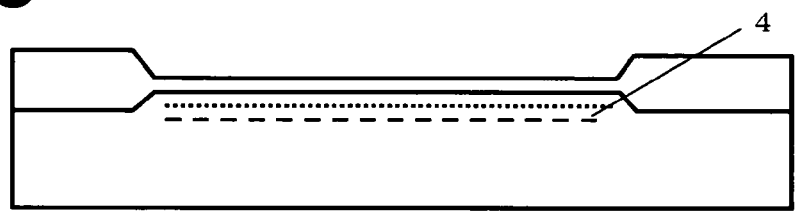

First, a well region is formed on a semiconductor substrate 1 as in a general MOS transistor manufacturing method, and a part where no device is to be formed is formed from a thick oxide film by LOCOS for device isolation (FIG. 6A).

Next, a resist is used as a mask to perform ion implantation for forming a low concentration N-type impurity region on a depletion type MOS transistor forming region of a device forming region. An ion implantation condition suited to a target threshold voltage is arbitrarily chosen as described above (FIG. 6B).

Next, the same resist is used as a mask to perform ion implantation for forming a low concentration P-type impurity region. In this step, too, an ion implantation condition suitable to reduce the threshold fluctuation is arbitrarily chosen as described above (FIG. 6C).

Figure 6D:
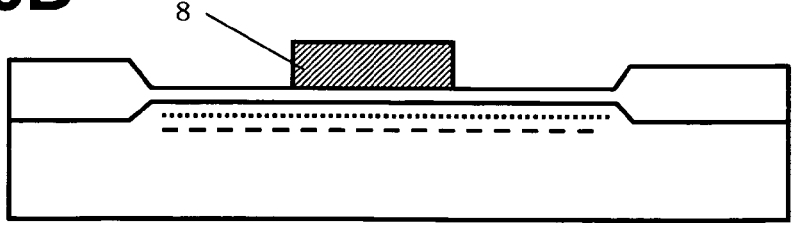

Next, a gate electrode of the depletion type MOS transistor is formed by depositing polysilicon, performing thermal diffusion, implanting impurities through ion implantation at a dose of $1 \times 10^{19}/cm^2$ and then performing patterning (FIG. 6D).

Figure 6E:
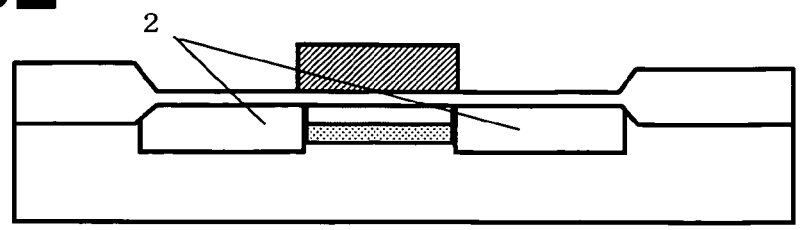

A source and a drain are formed next, to thereby complete the transistor as a semiconductor device (FIG. 6E).

As described above, this method only requires one more ion implantation step than the conventional method and no additional masking step. The precision in the threshold voltage of a depletion type N-channel transistor can therefore be enhanced without increasing the process cost.

Figure 3:
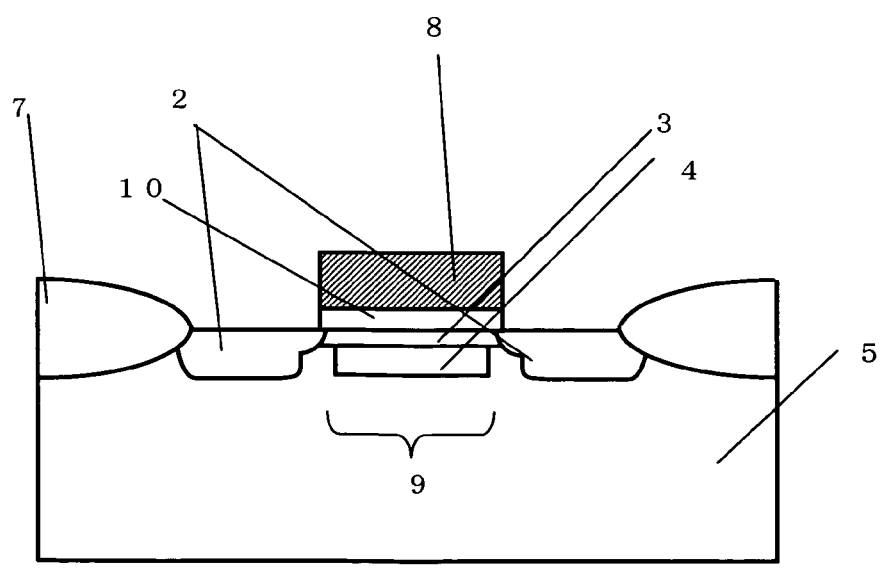
FIG. 3 is a schematic sectional view of a depletion type N-channel MOS transistor according to a second embodiment of the present invention.

FIG. 3 is a schematic sectional view illustrating a second embodiment of the present invention. Although conditions of the source and the drain are not described in the first embodiment, a low concentration drain is sometimes formed beside the gate electrode in order to reduce short-channel effects such as punch-through, and the withstand voltage may drop in a PN junction between the low concentration drain and the low concentration P-type impurity region under some conditions. The second embodiment avoids this problem by adding a masking step to form the low concentration P-type impurity region offset inward in the channel. An appropriate offset width, though varied depending on the necessary withstanding voltage, is between 0.5 μm and 1.5 μm.

The description given above takes as an example a depletion type N-channel MOS transistor. However, the structure and effects of the present invention are easily obtained also in a depletion type P-channel MOS transistor by simply changing the conductivity types of the implanted impurities. Specifically, the structure and effects of the present invention can be obtained by changing a low concentration N-type impurity region 3 of FIG. 1 which serves as a channel to a low concentration P-type impurity region and changing an underlying low concentration P-type impurity region 4 to a low concentration N-type impurity region.

What is claimed is:

1. A depletion normally-on type MOS transistor, comprising:
    a well region having a first conductivity type formed on a semiconductor substrate;
    a gate insulating film formed on the well region;
    a gate electrode formed on the gate insulating film, the gate electrode having a second conductivity type different from the first conductivity type;
    source and drain regions formed on respective sides of the gate electrode and within the well region, the source and drain regions having the second conductivity type;
    a first low concentration impurity region having the second conductivity type and being formed below the gate insulating film between the source and drain regions and within the well region, the first low concentration impurity region and the gate electrode having the same conductivity type to achieve normally-on operation of the MOS transistor; and
    a second low concentration impurity region having the first conductivity type and being formed within the well region and below the first low concentration impurity region between the source and drain regions, the second low concentration impurity region having a maximum peak concentration not greater than that of the first low concentration impurity region and greater than that of the well region.

2. A depletion normally-on type MOS transistor according to claim 1; wherein the second low concentration impurity region is disposed apart from the source and drain regions.

3. A depletion normally-on type MOS transistor according to claim 2; wherein the second low concentration impurity region is set at a distance of 0.5 μm to 1.5 μm from the source and drain regions.

4. A depletion normally-on type MOS transistor according to claim 1; wherein the second low concentration impurity region has a peak concentration of $5.0 \times 10^{16}/cm^3$ to $1.0 \times 10^{18}/cm^3$.

5. A depletion normally-on type MOS transistor according to claim 4; wherein the first low concentration impurity region has a peak concentration of $1.0 \times 10^{17}/cm^3$ to $5.0 \times 10^{18}/cm^3$.

6. A depletion normally-on type MOS transistor according to claim 1; wherein the second low concentration impurity region is disposed in direct contact with each of the source and drain regions.

7. A depletion normally-on type MOS transistor according to claim 1; wherein the second low concentration impurity region is not disposed in direct contact with each of the source and drain regions.

8. A depletion normally-on type MOS transistor according to claim 1; wherein the first conductivity type is a P-type conductivity and the second conductivity is an N-type conductivity.

9. A depletion normally-on type MOS transistor according to claim 1; wherein the second low concentration impurity region has an impurity concentration higher than that of the well region.

10. A semiconductor device comprising a depletion normally-on type MOS transistor according to claim 1.

11. A semiconductor device according to claim 10; wherein the second low concentration impurity region is disposed apart from the source and drain regions.

12. A semiconductor device according to claim 11; wherein the second low concentration impurity region is set at a distance of 0.5 μm to 1.5 μm from the source and drain regions.

13. A semiconductor device according to claim 10; wherein the second low concentration first conductivity type impurity region has a peak concentration of $5.0\times10^{18}/cm^3$ to $1.0\times10^{18}/cm^3$.

14. A semiconductor device according to claim 13; wherein the first low concentration impurity region has a peak concentration of $1.0\times10^{17}/cm^8$ to $5.0\times10^{18}/cm^3$.

15. A semiconductor device according to claim 10; wherein the second low concentration impurity region is disposed in direct contact with each of the source and drain regions.

16. A semiconductor device according to claim 10; wherein the second low concentration impurity region is not disposed in direct contact with each of the source and drain regions.

17. A semiconductor device according to claim 10; wherein the second low concentration impurity region is disposed in direct contact with the first low concentration impurity region.

18. A semiconductor device according to claim 10; wherein the second low concentration impurity region has an impurity concentration higher than that of the well region.

19. A semiconductor device according to claim 10; wherein the depletion normally-on type MOS transistor comprises a depletion normally-on type N-channel MOS transistor.

20. A semiconductor device according to claim 19; wherein the first conductivity type is a P-type conductivity and the second conductivity type is N-type conductivity.

* * * * *